US012382682B2

(12) United States Patent
Frougier et al.

(10) Patent No.: US 12,382,682 B2
(45) Date of Patent: Aug. 5, 2025

(54) GATE-ALL-AROUND NANOSHEET-FET WITH VARIABLE CHANNEL GEOMETRIES FOR PERFORMANCE OPTIMIZATION

(71) Applicant: INTERNATIONAL BUSINESS MACHINES CORPORATION, Armonk, NY (US)

(72) Inventors: Julien Frougier, Albany, NY (US); Ruilong Xie, Niskayuna, NY (US); Heng Wu, Guilderland, NY (US); Chen Zhang, Guilderland, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 758 days.

(21) Appl. No.: 17/453,882

(22) Filed: Nov. 8, 2021

(65) Prior Publication Data

US 2023/0142410 A1 May 11, 2023

(51) Int. Cl.
*H10D 62/10* (2025.01)
*H10D 30/01* (2025.01)
(Continued)

(52) U.S. Cl.
CPC ......... *H10D 62/121* (2025.01); *H10D 30/014* (2025.01); *H10D 30/43* (2025.01);
(Continued)

(58) Field of Classification Search
CPC .. H10D 62/121; H10D 30/014; H10D 64/017; H10D 30/43; H10D 30/6735;
(Continued)

(56) References Cited

U.S. PATENT DOCUMENTS

| | | | |
|---|---|---|---|
| 9,972,701 | B2 | 5/2018 | Kim |
| 10,290,549 | B2 | 5/2019 | Xie |
| 10,297,664 | B2 | 5/2019 | Xie |
| 10,312,323 | B2 | 6/2019 | Cheng |
| 10,332,803 | B1 | 6/2019 | Xie |
| 10,381,459 | B2 | 8/2019 | Xie |
| 10,388,732 | B1 | 8/2019 | Frougier |

(Continued)

FOREIGN PATENT DOCUMENTS

JP 2011029503 A 2/2011

OTHER PUBLICATIONS

Notification of Transmittal of The International Search Report and The Written Opinion of The International Searching Authority, or The Declaration, Date of mailing Jan. 24, 2023, Applicant's or agent's file reference, International application No. PCT/EP2022/080745, 13 pages.

*Primary Examiner* — Ajay Ojha
*Assistant Examiner* — Sandra Milena Rodriguez Villanu
(74) *Attorney, Agent, or Firm* — Samuel A. Waldbaum

(57) ABSTRACT

A semiconductor device comprising a first nanosheet located on top of a substrate, wherein the first nanosheet is tapered the Y-direction to have a width $W_1$ and the first nanosheet is tapered in the X-direction to have a length $L_1$. A second nanosheet located on top of the first nanosheet, wherein the second nanosheets is tapered in the Y-direction to have a width $W_2$ and the first nanosheet is tapered in the X-direction to have a length $L_2$. Wherein the widths $W_1$ and $W_2$ are different from each other and the lengths $L_1$ and $L_2$ are different from each other and wherein the substrate includes a tapered surface in the Y-direction.

18 Claims, 13 Drawing Sheets

(51) Int. Cl.
*H10D 30/43* (2025.01)
*H10D 30/67* (2025.01)
*H10D 64/01* (2025.01)

(52) U.S. Cl.
CPC ..... *H10D 30/6735* (2025.01); *H10D 30/6757* (2025.01); *H10D 64/017* (2025.01)

(58) Field of Classification Search
CPC ................ H10D 30/6757; B82Y 10/00; H01L 29/66439; H01L 29/78696; H01L 29/775; H01L 29/42392; H01L 29/0673
See application file for complete search history.

(56) References Cited

U.S. PATENT DOCUMENTS

| | | | |
|---|---|---|---|
| 10,586,799 | B2 | 3/2020 | Cheng |
| 10,636,709 | B2 | 4/2020 | Xu |
| 10,756,178 | B2 | 8/2020 | Chao |
| 10,903,317 | B1 | 1/2021 | Frougier |
| 2017/0256609 | A1* | 9/2017 | Bhuwalka ........... H01L 29/1037 |
| 2018/0301531 | A1 | 10/2018 | Xie |
| 2019/0288117 | A1 | 9/2019 | Xie |
| 2020/0365464 | A1 | 11/2020 | Sreenivasan |
| 2020/0373402 | A1 | 11/2020 | Yang |
| 2021/0036122 | A1* | 2/2021 | Wong ............. H01L 21/823814 |

* cited by examiner

125

GATE-ALL-AROUND NANOSHEET-FET WITH VARIABLE CHANNEL GEOMETRIES FOR PERFORMANCE OPTIMIZATION

BACKGROUND

The present invention generally relates to the field of nano devices, and more particularly stacked nanodevices with different geometries between the devices.

Nanosheet is the lead device architecture for continuing CMOS scaling. However, nanosheet technology has shown increased scaling and performance challenges beyond 45 nm CPP. Nanosheet channels having a width greater than 25 nm have the tendency to perform as a double gate configuration rather than a true Gate-All-Around configuration which is less ideal from an electrostatic control standpoint.

BRIEF SUMMARY

Additional aspects and/or advantages will be set forth in part in the description which follows and, in part, will be apparent from the description, or may be learned by practice of the invention.

A semiconductor device comprising a first nanosheet having a tapered profile in the Y-direction to have a width $W_1$ and the first nanosheet is tapered in the X-direction to have a length $L_1$. A second nanosheet having a tapered fin profile in the Y-direction to have a width $W_2$ and the first nanosheet is tapered in the X-direction to have a length $L_2$. Wherein the widths $W_1$ and $W_2$ are different from each other and the lengths $L_1$ and $L_2$ are different from each other.

A semiconductor device comprising a first nanosheet located on top of a substrate, wherein the first nanosheet is tapered in the Y-direction to have a width $W_1$ and the first nanosheet is tapered in the X-direction to have a length $L_1$. A second nanosheet located on top of the first nanosheet, wherein the second nanosheets is tapered in the Y-direction to have a width $W_2$ and the first nanosheet is tapered in the X-direction to have a length $L_2$. Wherein the widths $W_1$ and $W_2$ are different from each other and the lengths $L_1$ and $L_2$ are different from each other and wherein the substrate includes a tapered surface in the Y-direction.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 1:
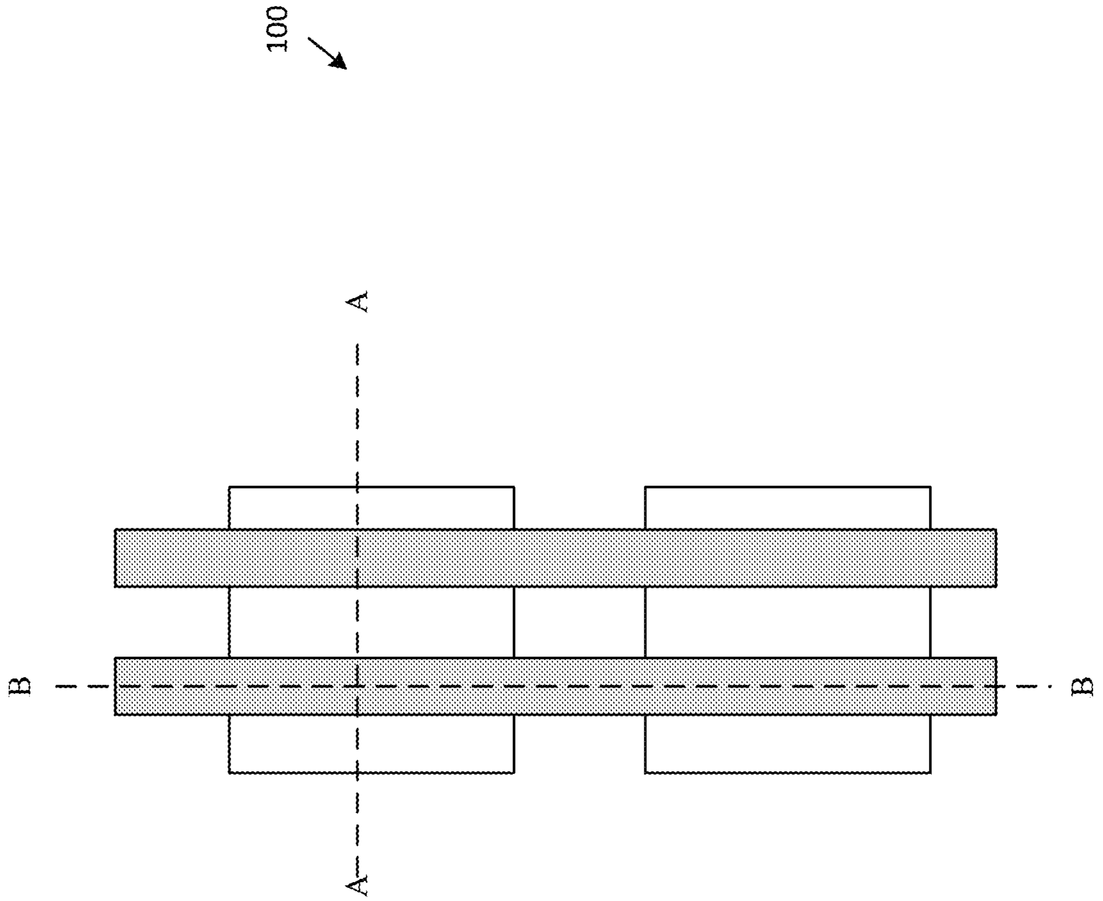
FIG. 1 illustrates a top-down view of a nano device, in accordance with an embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art of affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various process used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, wherein like reference numerals refer to like elements throughout. The present invention solves the co-optimization problem in a stacked nanosheet by using a bi-directional taper profile of the Fins. The bi-directional taper profile enables the nanosheets to have variable sheet width and variable channel length within the same device. This provides co-optimization for Contacted-gate-Poly-Pitch (CPP) scaling, subthreshold slope (SS), contact resistance and Drive Current requirements. Device design optimization is required to preserve optimal SS for each individual channels while maximizing the effective width of the channel (W) for device performance. The present invention is directed to GAA device where each sheet has a different width ($W_1<W_2<W_3$) and each sheet has a different gate length ($L_1>L_2>L_3$). The different sheet width and sheet lengths enables different channel geometries. The device preserves the optimal electrostatics for every Si channel while maximizing W and Gate-to-Gate space to reduce the contact resistance.

The nanodevice of the present invention exhibits a Fin with a tapered profile in the Y-direction and a tapered profile in the X-direction. The tapered profile in the Y-direction causes the variations of the widths of the nanosheets within the device. The tapered profile in the X-direction causes variations of the length of the nanosheets within the device. The nanodevice of the present invention has a nanosheet stack structure with at least two stacked sheets and at least one sheet having a different width from the other. The nanodevice of the present invention has a base or substrate that has a taper angle equal or different from the Fin taper angle. The nanodevice of the present invention can exhibit a Bottom Dielectric Isolation layer with tapered sidewalls under the nanosheet stack in the Y-direction.

FIG. 1 illustrates a top-down view of a nano device 100, in accordance with an embodiment of the present invention. The nano device 100 can include a plurality of nanosheets, a nanowire, a plurality of nanowires, or a combination thereof. The present disclosure provides an example utilizing a plurality of nanosheets, but nanowires can be substituted for the nanosheets at the top of the nano stack 102.

Figure 3:
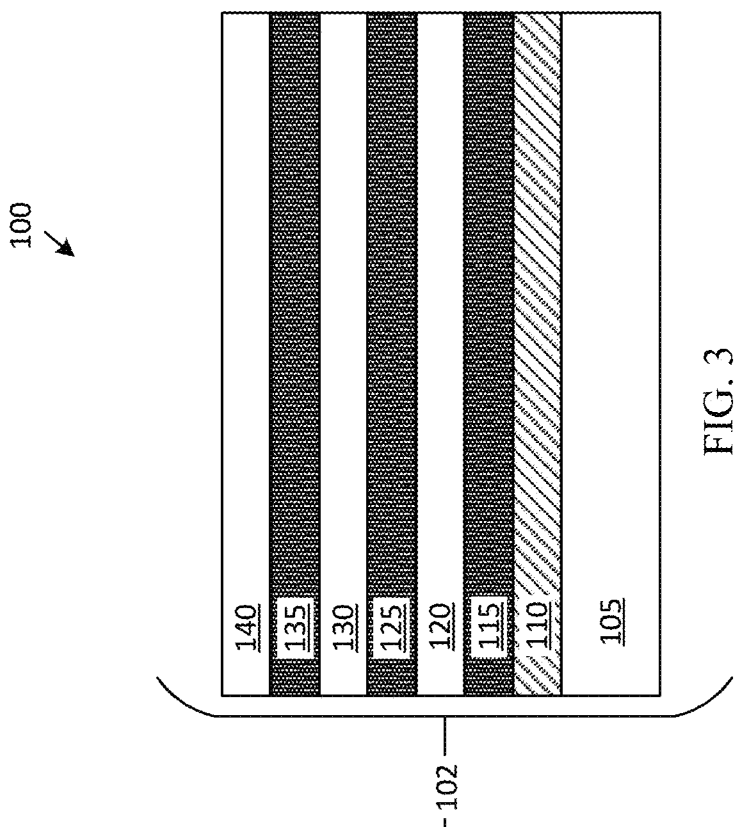
FIG. 3 illustrates cross section B of the nano device illustrating the nano stack, in accordance with the embodiment of the present invention.
Figure 2:
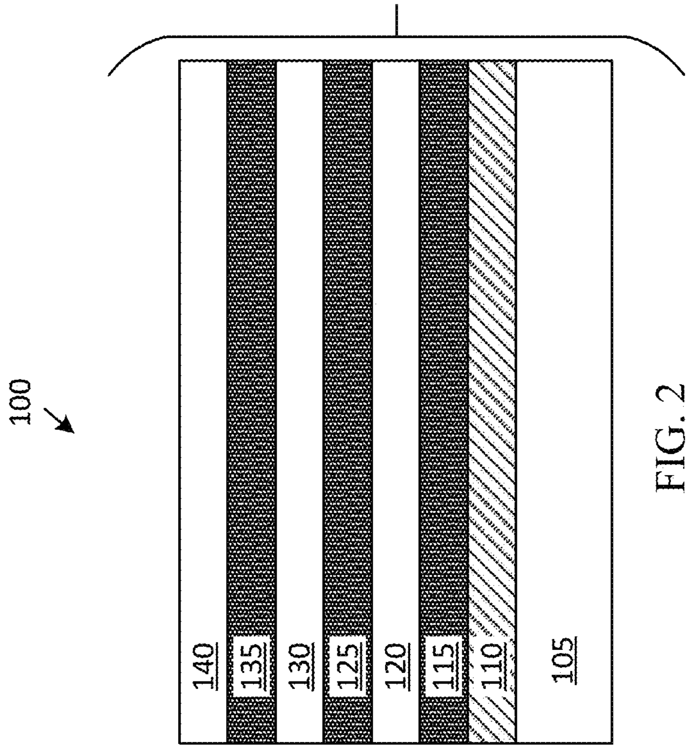
FIG. 2 illustrates cross section A of the nano device illustrating the nano stack, in accordance with the embodiment of the present invention.

FIG. 2 illustrates cross section A of the nano device 100 illustrating the nano stack 102, in accordance with the embodiment of the present invention. FIG. 3 illustrates cross section B of the nano device 100 illustrating the nano stack 102, in accordance with the embodiment of the present invention. The nano stack 102 includes a substrate 105, a first layer 110, a second layer 115, a third layer 120, a fourth layer 125, a fifth layer 130, a sixth layer 135, and a seventh layer 140. The number of layers is determined by the number of desired channels in the final product. The substrate 105, can be, for example, a material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or another like semiconductor. In addition, multiple layers of the semiconductor materials can be used as the semiconductor material of the substrate 105. In some embodiments, the substrate 105 includes both semiconductor materials and dielectric materials. The semiconductor substrate 105 may also comprise an organic semiconductor or a layered semiconductor such as, for example, Si/SiGe, a silicon-on-insulator or a SiGe-on-insulator. A portion or entire semiconductor substrate 105 may also be comprise of an amorphous, polycrystalline, or monocrystalline. The first layer 110 can be comprised of, for example, SiGe, where Ge is in the range of about 45% to 70%. The second layer 115 can be comprised of, for example, SiGe, where Ge is the range of about 15% to 35%. The difference in Ge percentage allows for the differentiating of the first layer 110 and the second layer 115 and allows for the selective removal of the first layer 110 in a during a downstream processing step, which will be described down below. The third layer 120 can be comprised of, for example, Si. The fourth layer 125 can be comprised of, for example, SiGe, where Ge is the range of about 15% to 35%. The fifth layer 130 can be comprised of, for example, Si. The sixth layer 135 can be comprised of, for example, SiGe, where Ge is the range of about 15% to 35%. The seventh layer 140 can be comprised of, for example, Si.

Figure 5:
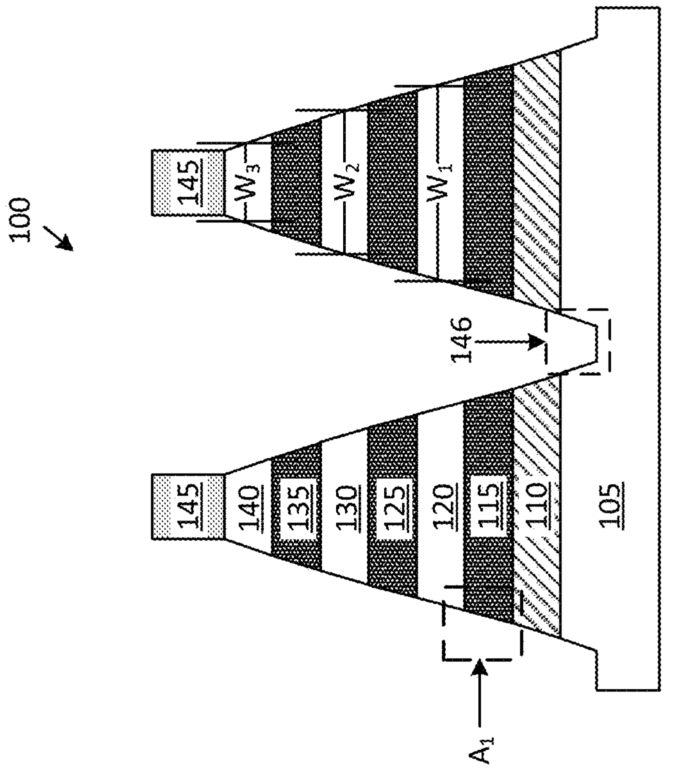
FIG. 5 illustrates cross section B of the nano device after etching a taper into the nano stack, in accordance with the embodiment of the present invention.
Figure 4:
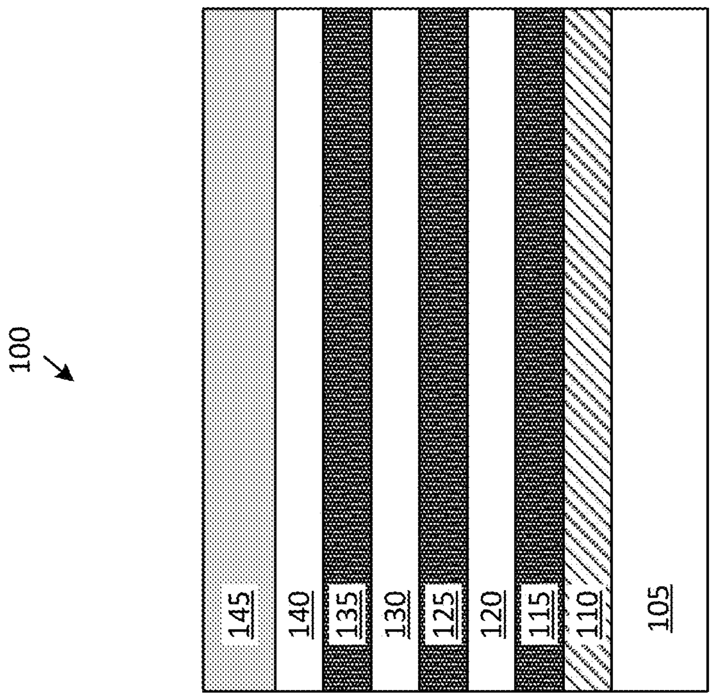
FIG. 4 illustrates cross section A of the nano device illustrating the nano stack, in accordance with the embodiment of the present invention.

FIG. 4 illustrates cross section A of the nano device 100 illustrating the nano stack 102, in accordance with the embodiment of the present invention. FIG. 5 illustrates cross section B of the nano device after etching a taper into the nano stack 102, in accordance with the embodiment of the present invention. A hard mask 145 is formed on top of the seventh layer 140, and the hard mask is patterned for the tapering etch. The nano stack 102 can be etch by, for example, reactive ion etch (RIE). The nano stack 102 is etched along the Y-axis (i.e., cross section B) to taper the width of the nano stack 102 as illustrated by FIG. 5. The taper of the nano stack 102 is such that each layer is progressively wider when going from the top layer to the bottom layer (e.g, the seventh layer 140 to the first layer 110). For example, the third layer 120 has a width $W_1$, the fifth layer 130 has a width $W_2$, and the seventh layer 140 has a width $W_3$. The tapering of the nano stack 102 means that $W_1>W_2>W_3$. The nano stack 102 is etched such that the outer surface of each layer is angled $A_1$. A portion of the substrate 105 is etched from the etching of the nano stack 102, causing a trench 146 to be formed in the substrate 105. The trench 146 can have angled side walls that match the angle $A_1$ of the nano stack 102, or the angle of the side walls of the trench 146 does not have to match angle $A_1$.

Figure 7:
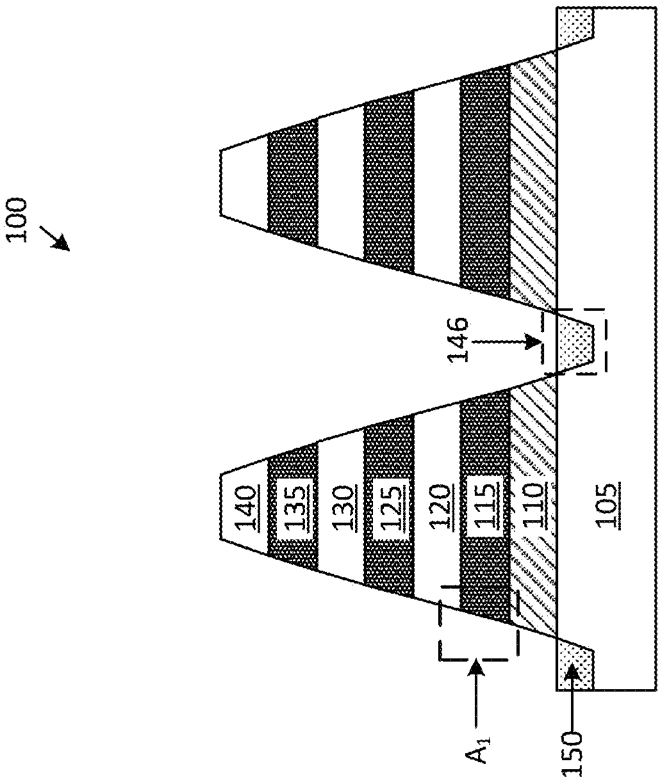
FIG. 7 illustrates cross section B of the nano device after filling in the trench, in accordance with the embodiment of the present invention.
Figure 6:
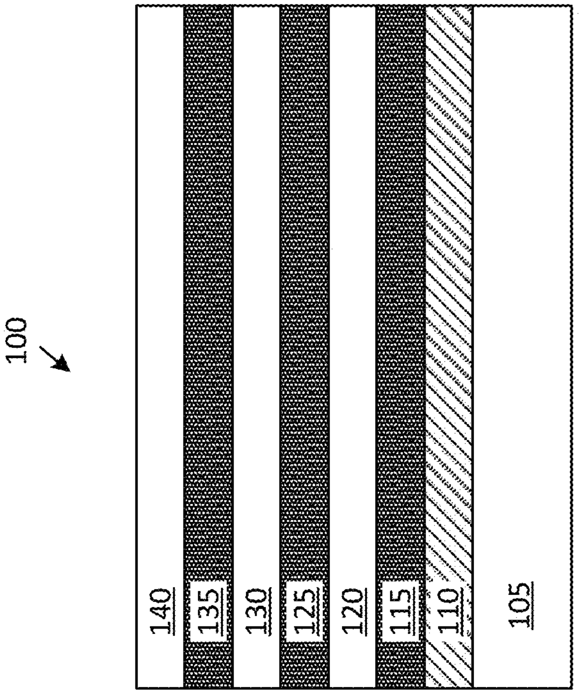
FIG. 6 illustrates cross section A of the nano device illustrating the nano stack, in accordance with the embodiment of the present invention.

FIG. 6 illustrates cross section A of the nano device 100 illustrating the nano stack 102, in accordance with the embodiment of the present invention. FIG. 7 illustrates cross section B of the nano device 100 after filling in the trench

146, in accordance with the embodiment of the present invention. The trench 146 is filled in with a shallow trench isolation (STI) layer 150. The top of the STI layer 150 extends up to the bottom of the first layer 110.

Figure 9:
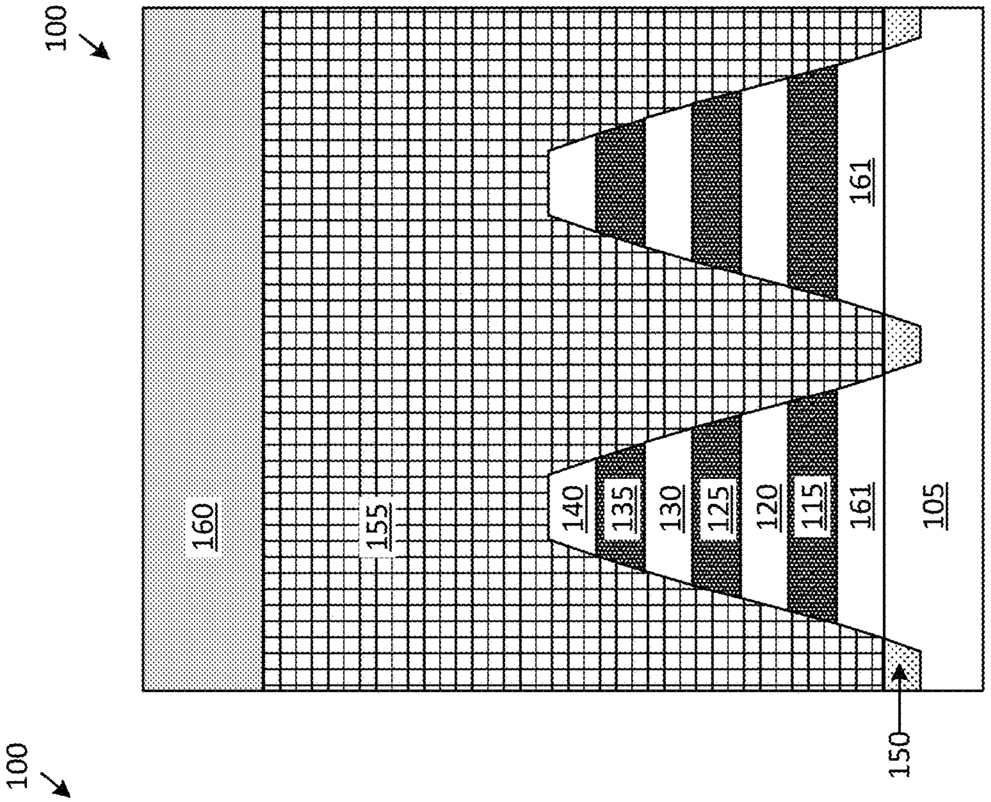
FIG. 9 illustrates cross section B of the nano device after formation the dummy gate and the selective removal of the first layer, in accordance with the embodiment of the present invention.
Figure 8:
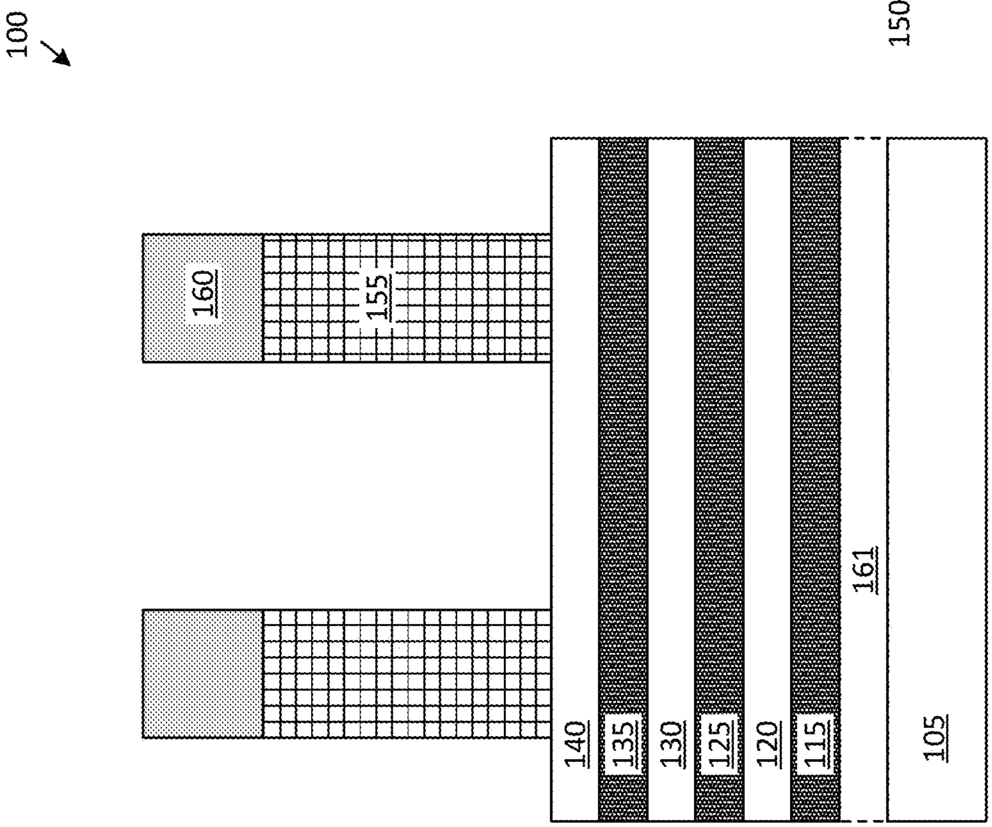
FIG. 8 illustrates cross section A of the nano device after formation a dummy gate and the selective removal of the first layer, in accordance with the embodiment of the present invention.

FIG. 8 illustrates cross section A of the nano device 100 after formation a dummy gate 155 and the selective removal of the first layer 110, in accordance with the embodiment of the present invention. FIG. 9 illustrates cross section B of the nano device 100 after formation the dummy gate 155 and the selective removal of the first layer 110, in accordance with the embodiment of the present invention. A dummy gate 155 is formed on top of the STI layer 150 and located around the tapered side walls of the nano stack 102 as illustrated by FIG. 9. A hard mask 160 is formed on top of the dummy gate 155. The dummy gate 155 can be comprised of, for example, amorphous-Si. As illustrated by FIG. 8, the dummy gate is formed on top of the seventh layer 140. The hard mask 160 and the dummy gate 155 are patterned and etched to form locations for the formation of the gate, which will be described down below. The first layer 110 is selectively removed to create open spaces 161 located between the substrate 105 and the second layer 115. The first layer 110 can be selectively targeted for removal because of the higher percentage of Ge when compared to the other layers containing Ge.

Figure 11:
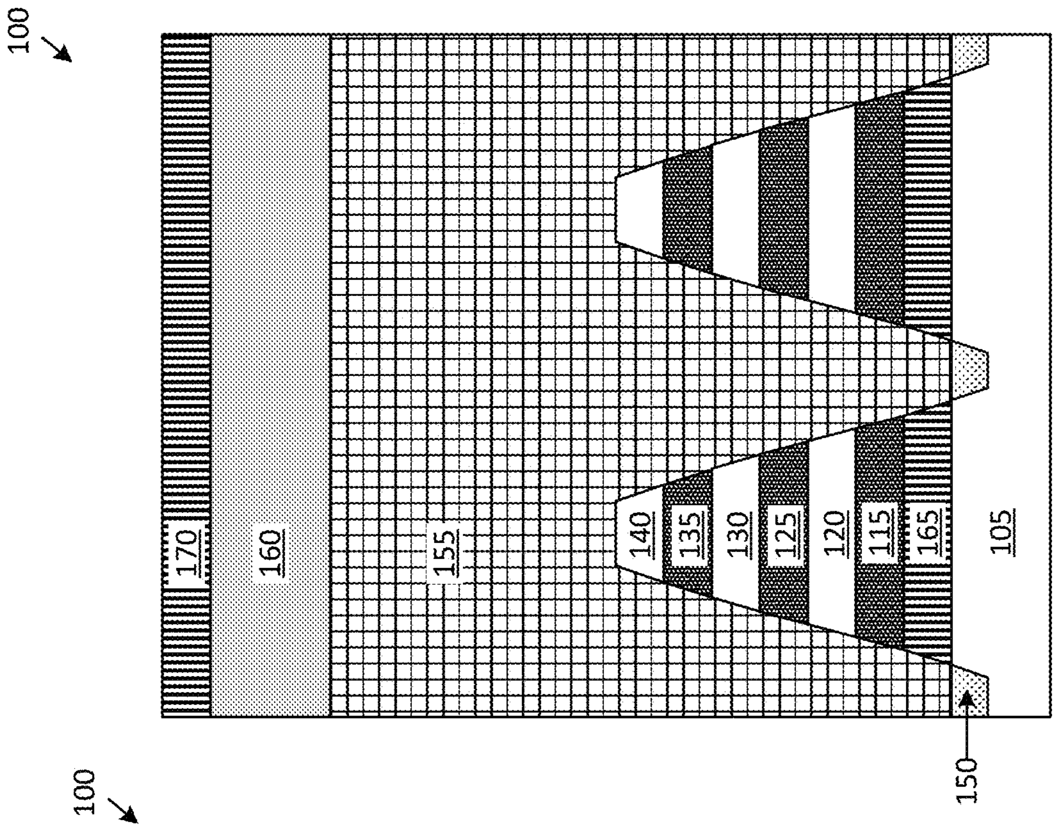
FIG. 11 illustrates cross section B of the nano device after formation a bottom dielectric isolation layer and a dielectric layer, in accordance with the embodiment of the present invention.
Figure 10:
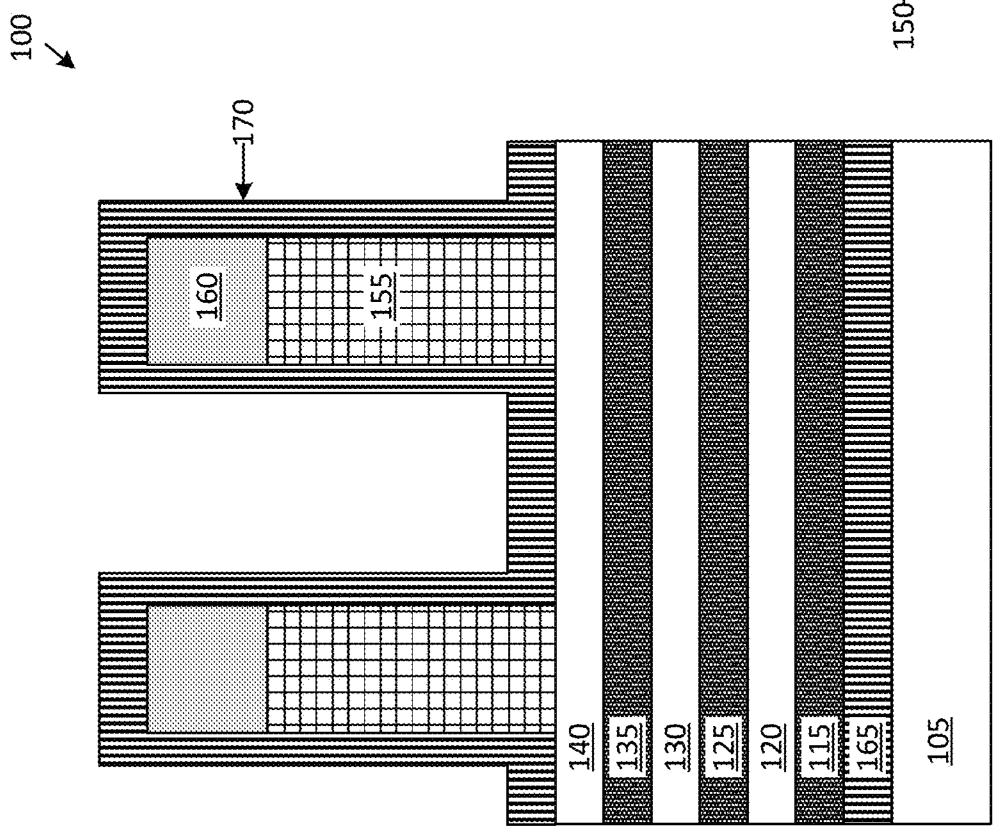
FIG. 10 illustrates cross section A of the nano device after formation a bottom dielectric isolation layer and a dielectric layer, in accordance with the embodiment of the present invention.

FIG. 10 illustrates cross section A of the nano device 100 after formation a bottom dielectric isolation layer 165 and a dielectric layer 170, in accordance with the embodiment of the present invention. FIG. 11 illustrates cross section B of the nano device 100 after formation a bottom dielectric isolation layer 165 and a dielectric layer 170, in accordance with the embodiment of the present invention. The open space 161 located between the substrate 105 and the second layer 115 is filled with a low-k bottom dielectric layer 165. A dielectric layer 170 is formed on top of the exposed surface of the seventh layer 140. The dielectric layer 170 is also formed around the dummy gate 155 and the hard mask 160, as illustrated by FIG. 10.

Figure 13:
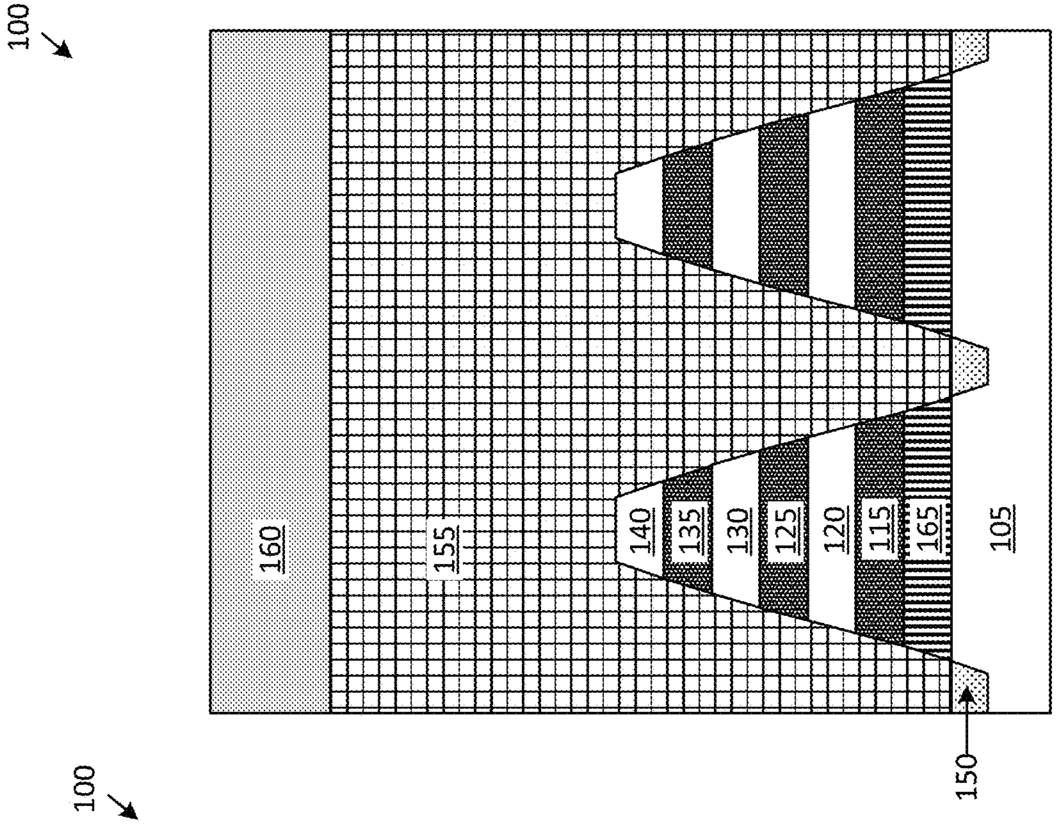
FIG. 13 illustrates cross section B of the nano device after the nano stack was tapered along its length, in accordance with the embodiment of the present invention.
Figure 12:
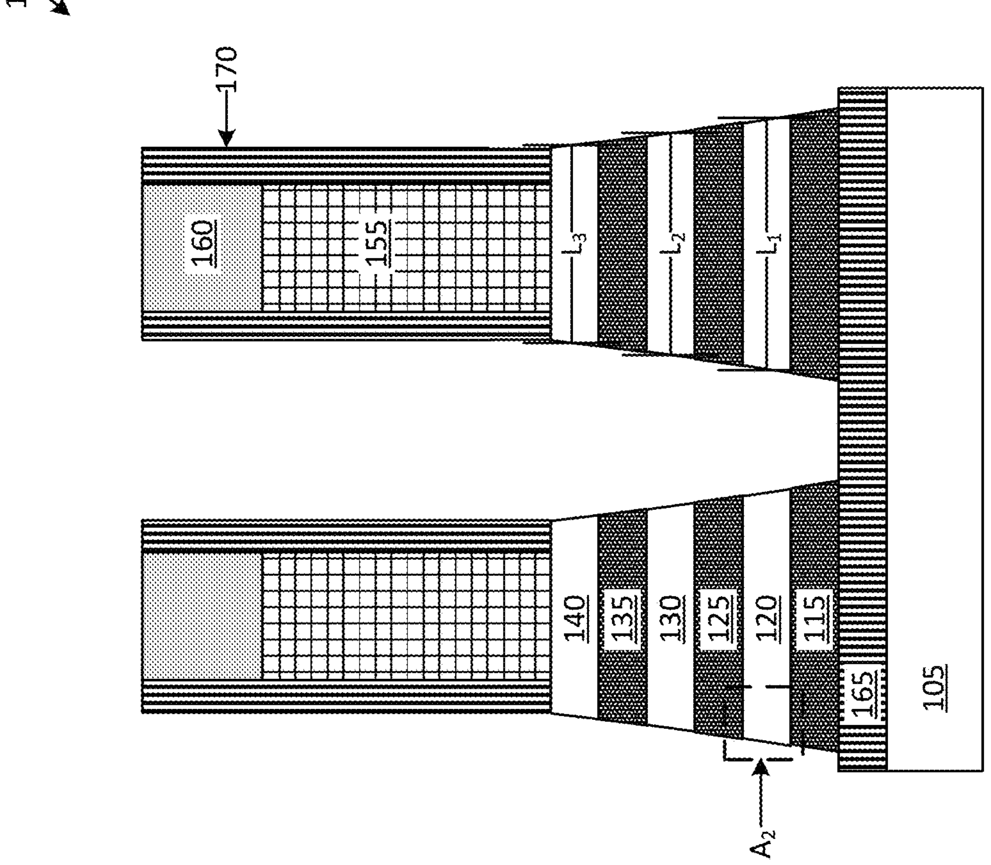
FIG. 12 illustrates cross section A of the nano device after tapering of the nano stack along its length, in accordance with the embodiment of the present invention.

FIG. 12 illustrates cross section A of the nano device 100 after tapering of the nano stack 102 along its length, in accordance with the embodiment of the present invention. FIG. 13 illustrates cross section B of the nano device 100 after the nano stack 102 was tapered along its length, in accordance with the embodiment of the present invention. The nano stack 102 can be etch by, for example, reactive ion etch (RIE). The nano stack 102 is etched along the X-axis (i.e., cross section A) to taper the length of the nano stack 102 as illustrated by FIG. 12. The taper of the nano stack 102 is such that each layer is progressively longer when going from the top layer to the bottom layer (e.g, the seventh layer 140 to the second layer 115). For example, the third layer 120 has a length $L_1$, the fifth layer 130 has a length $L_2$, and the seventh layer has a length $L_3$. The nano stack 102 is tapered so that $L_1>L_2>L_3$. The outside edge of each of the layers of the nano stack 102 is etched at a tapered angle $A_2$. The etching also exposes the top surface of the hard mask 160. Angle $A_2$ can equal to, greater than, or smaller than angle $A_1$.

Figure 15:
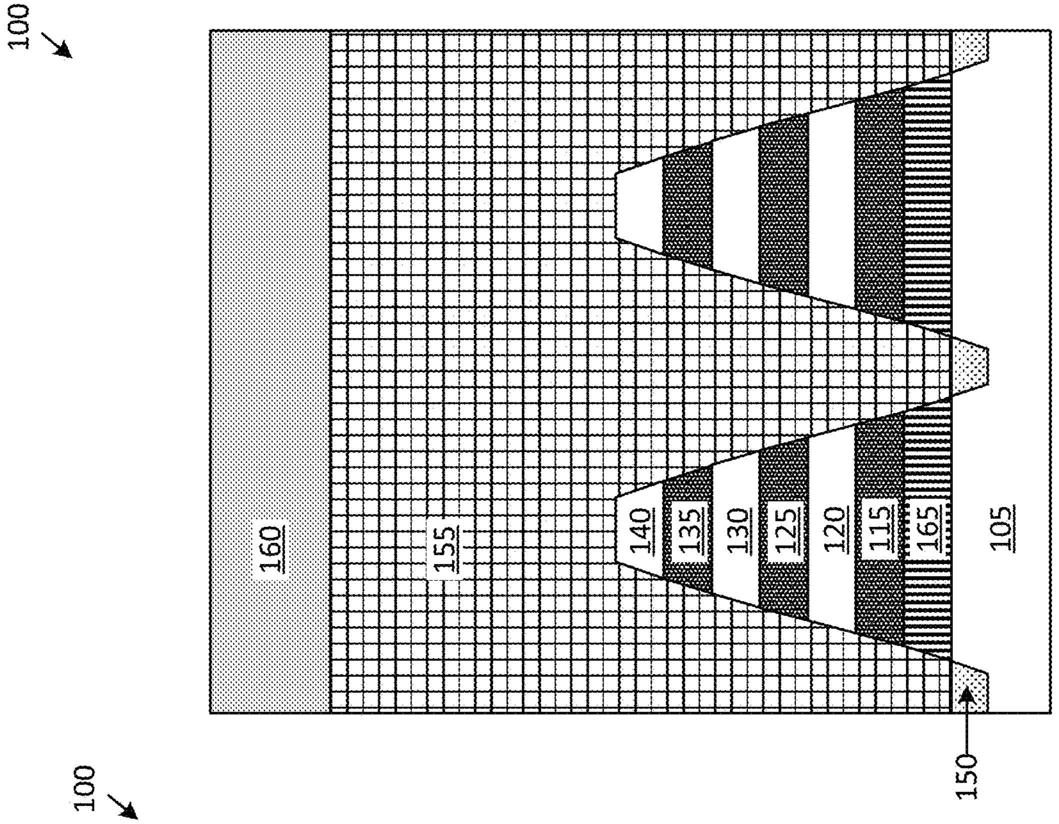
FIG. 15 illustrates cross section B of the nano device after formation of the inner spacer, in accordance with the embodiment of the present invention.
Figure 14:
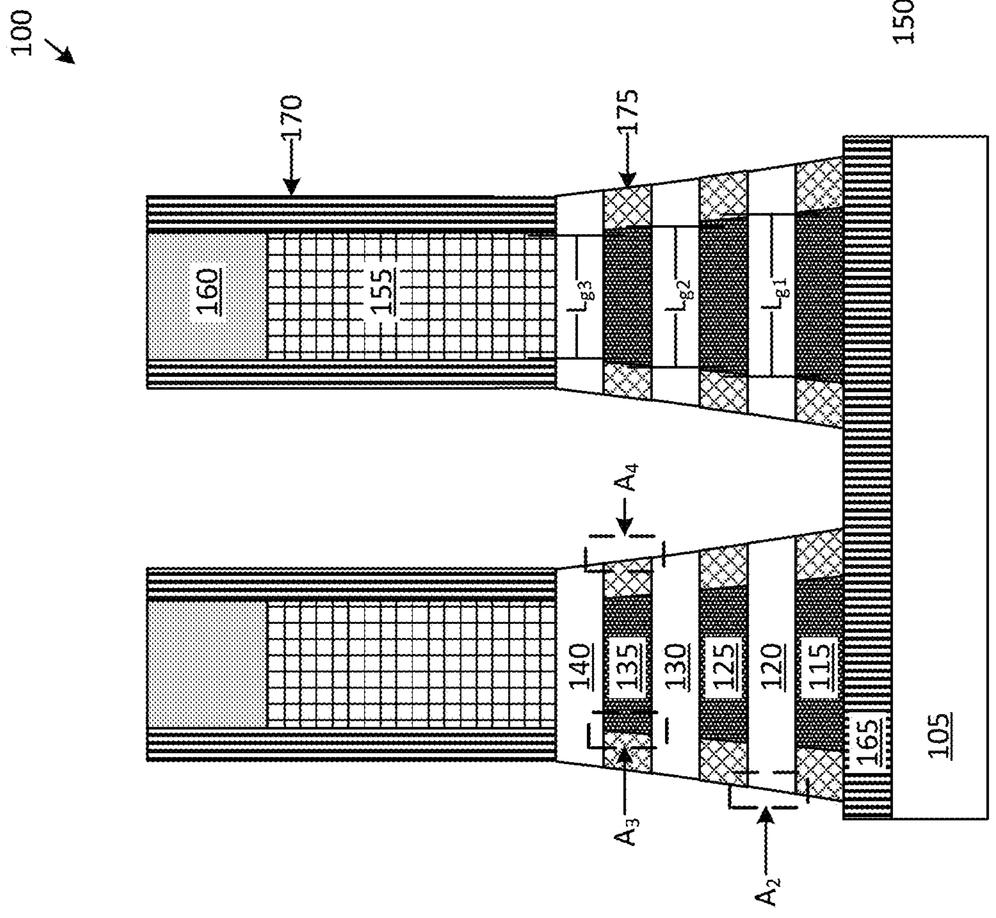
FIG. 14 illustrates cross section A of the nano device after formation of the inner spacer, in accordance with the embodiment of the present invention.

FIG. 14 illustrates cross section A of the nano device 100 after formation of the inner spacer 175, in accordance with the embodiment of the present invention. FIG. 15 illustrates cross section B of the nano device 100 after formation of the inner spacer 175, in accordance with the embodiment of the present invention. The second layer 115, the fourth layer 125, and the sixth layer 135 are recessed to create an opening for the formation of the inner spacer 175. The inner spacer 175 is formed where the second layer 115, the fourth layer 125, and the sixth layer 135 were recessed. The outer surface of the second layer 115, the fourth layer 125, and the sixth layer 135 is tapered at angle A2, so when the layers are recessed then the tapered angled $A_2$ is maintained to the new recessed edge of the second layer 115, the fourth layer 125, and the sixth layer 135. After recessing process, the second layer 115, the fourth layer 125, and the sixth layer 135 has an outer edge at tapered angle $A_3$, where angle $A_3$=angle $A_2$. The inner spacer 175 is etched to remove excess spacer material such that the inner spacer 175 has an outer tapered surface at a tapered angle $A_4$. The tapered angle $A_4$ should be substantially equal to angle $A_2$ and angle $A_3$. Since the second layer 115, the fourth layer 125, and the sixth layer 135 were tapered prior to recessing it causes the gate lengths of the channels to be different. For example, the third layer 120 has a gate length $Lg_1$, the fifth layer 130 has a gate length $Lg_2$, and the seventh layer has a gate length $Lg_3$. When the gates are formed, as described below, then then gate lengths have the following relationship $Lg_1>Lg_2>Lg_3$.

Figure 16:
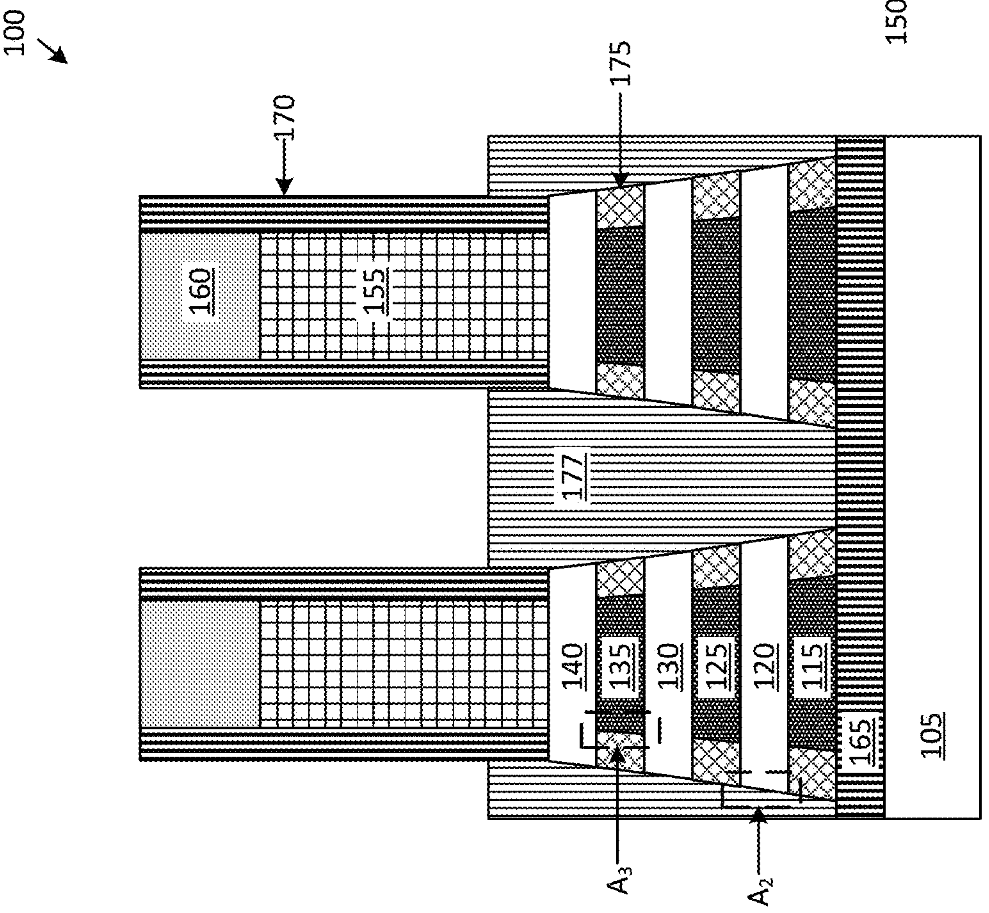
FIG. 16 illustrates cross section A of the nano device after formation of the source/drain epi, in accordance with the embodiment of the present invention.
Figure 17:
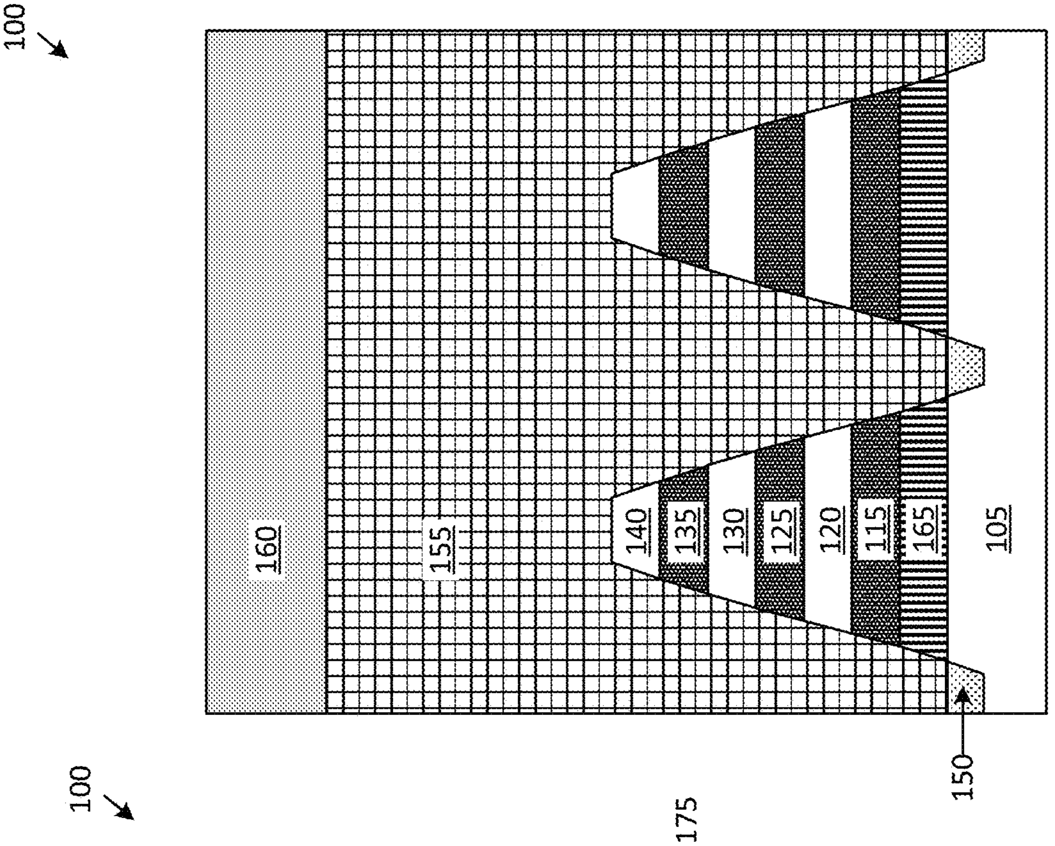
FIG. 17 illustrates cross section B of the nano device after formation of the source/drain epi, in accordance with the embodiment of the present invention.

FIG. 16 illustrates cross section A of the nano device 100 after formation of the source/drain epi 177, in accordance with the embodiment of the present invention. FIG. 17 illustrates cross section B of the nano device 100 after formation of the source/drain epi 177, in accordance with the embodiment of the present invention. A source/drain epi 177 is formed around the tapered nano stack 102. The source/drain epi 177 is in direct contact with the bottom dielectric isolation layer 165, the inner spacer 175, the third layer 120, the fifth layer 130, the seventh layer 140, and a portion of the dielectric layer 170. The source/drain epi 177 can be for example, a n-type epi, or a p-type epi. For n-type epi, an n-type dopant selected from a group of phosphorus (P), arsenic (As) and/or antimony (Sb) can be used. For p-type epi, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

Figure 18:
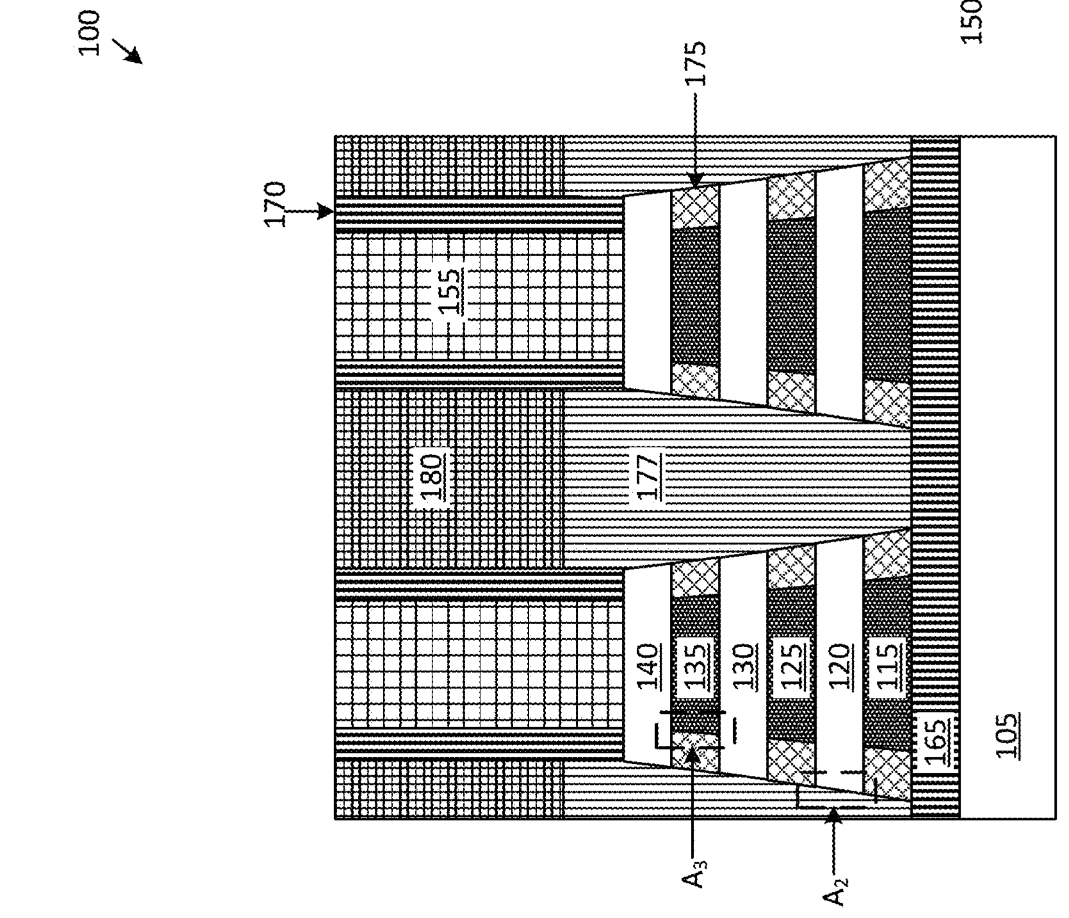
FIG. 18 illustrates cross section A of the nano device after formation of the interlayered dielectric layer, in accordance with the embodiment of the present invention.
Figure 19:
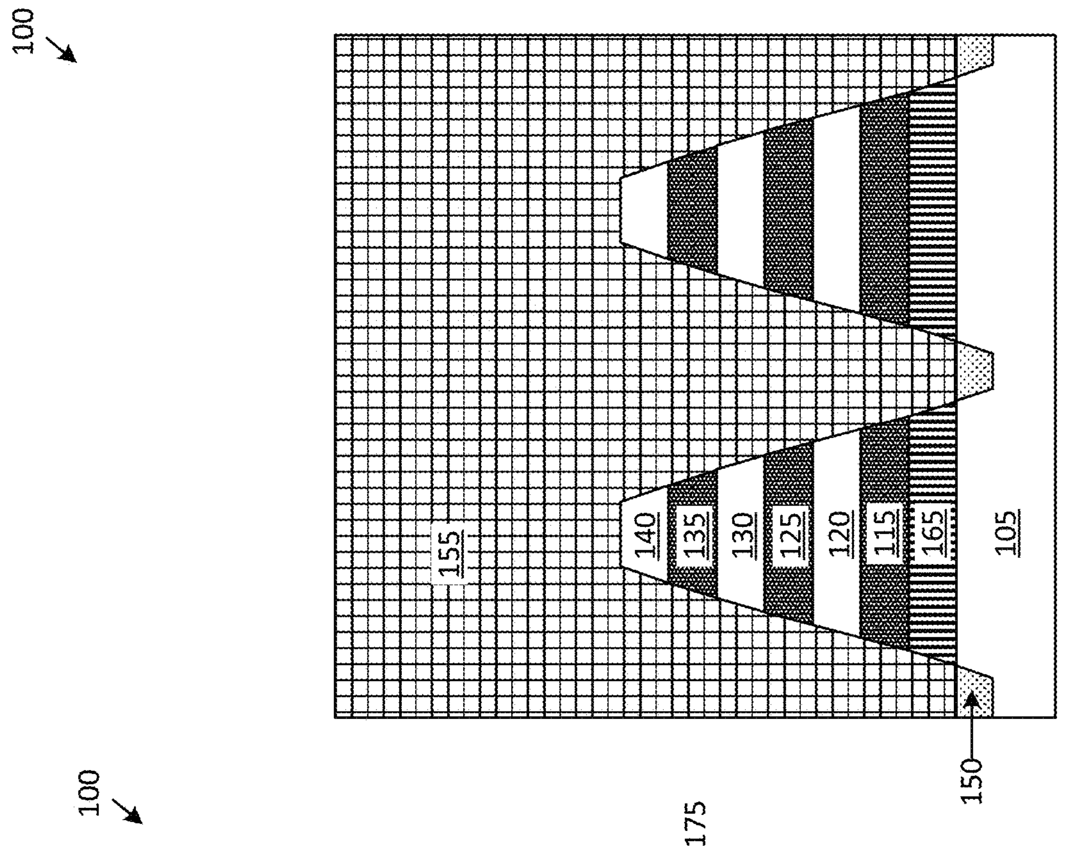
FIG. 19 illustrates cross section B of the nano device after formation of the interlayered dielectric layer, in accordance with the embodiment of the present invention.

FIG. 18 illustrates cross section A of the nano device 100 after formation of the interlayered dielectric layer 180, in accordance with the embodiment of the present invention. FIG. 19 illustrates cross section B of the nano device 100 after the nano stack after formation of the interlayered dielectric layer 180, in accordance with the embodiment of the present invention. An interlayered dielectric (ILD) layer 180 is formed on top of the source/drain epi 177 around the dielectric layer 170. The ILD layer 180 can be comprised of, for example $SiO_2$. The ILD layer 180, the dielectric layer 170, the hard mask 160 are planarized to create a uniform top surface across the ILD layer 180, the dielectric layer 170, and the dummy gate 155.

Figure 20:
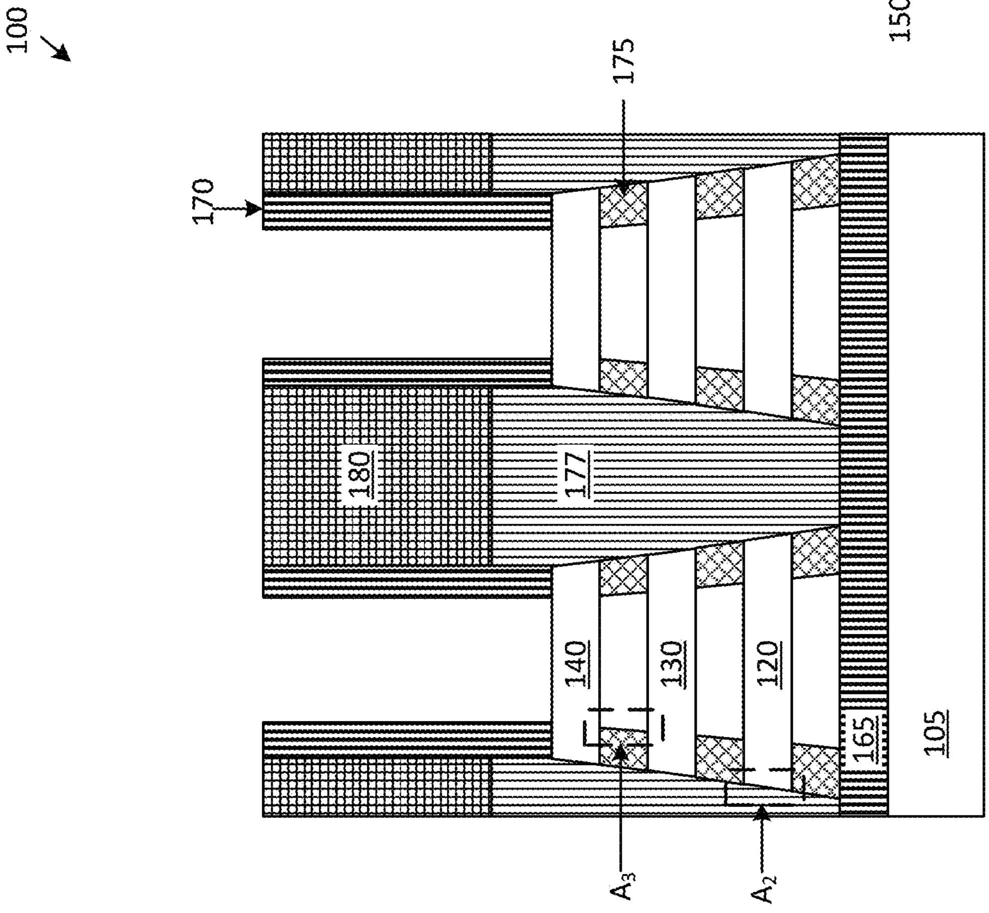
FIG. 20 illustrates cross section A of the nano device after the selective removal of some of the layers, in accordance with the embodiment of the present invention.
Figure 21:
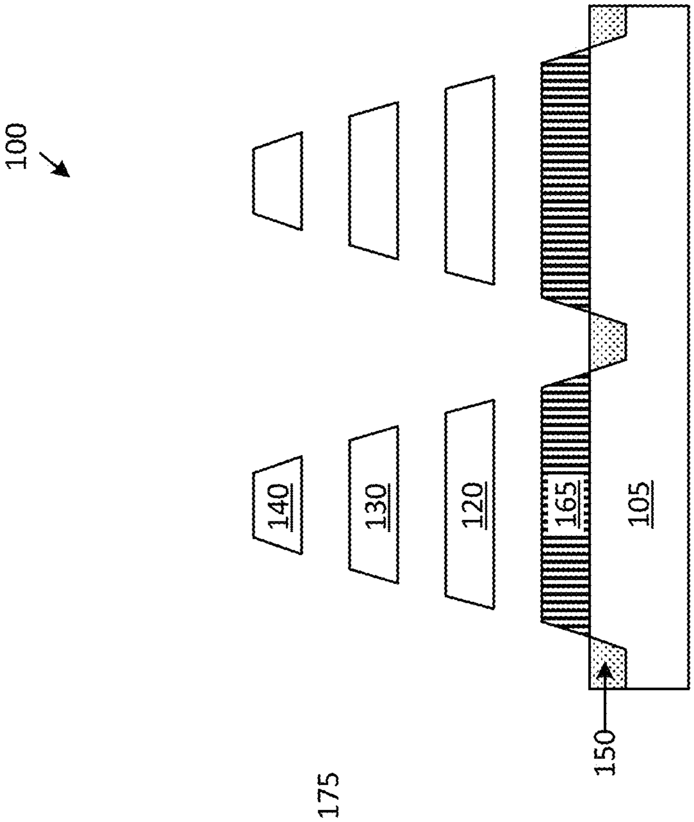
FIG. 21 illustrates cross section B of the nano device after the selective removal of some of the layers, in accordance with the embodiment of the present invention.

FIG. 20 illustrates cross section A of the nano device 100 after the selective removal of some of the layers, in accordance with the embodiment of the present invention. FIG. 21 illustrates cross section B of the nano device 100 after the selective removal of some of the layers, in accordance with the embodiment of the present invention. The dummy gate 155, the second layer 115, the fourth layer 125, and the sixth layer 135 are removed. The removal of these layers exposes some of the surfaces of the third layer 120, the fifth layer 130 and the seventh layer 140. The removal of the dummy gate 155, the second layer 115, the fourth layer 125, and the sixth layer 135 allows for the formation of the gate 185 around the third layer 120, the fifth layer 130 and the seventh layer 140.

Figure 22:
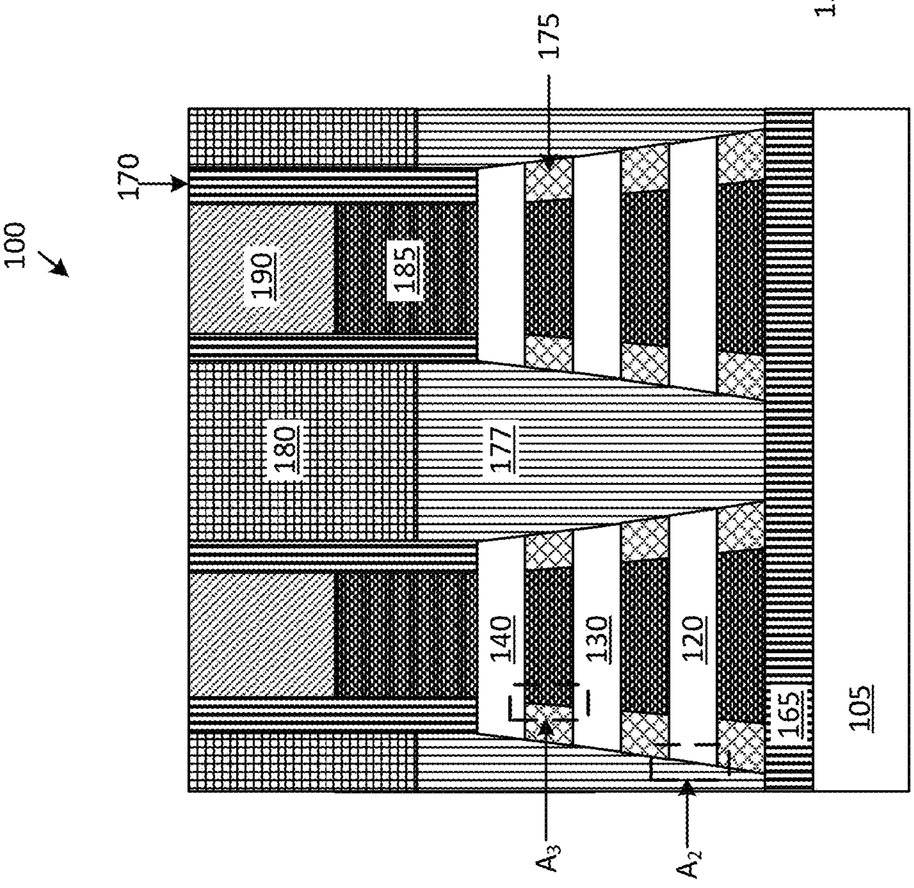
FIG. 22 illustrates cross section A of the nano device after the formation of the gate, in accordance with the embodiment of the present invention.
Figure 23:
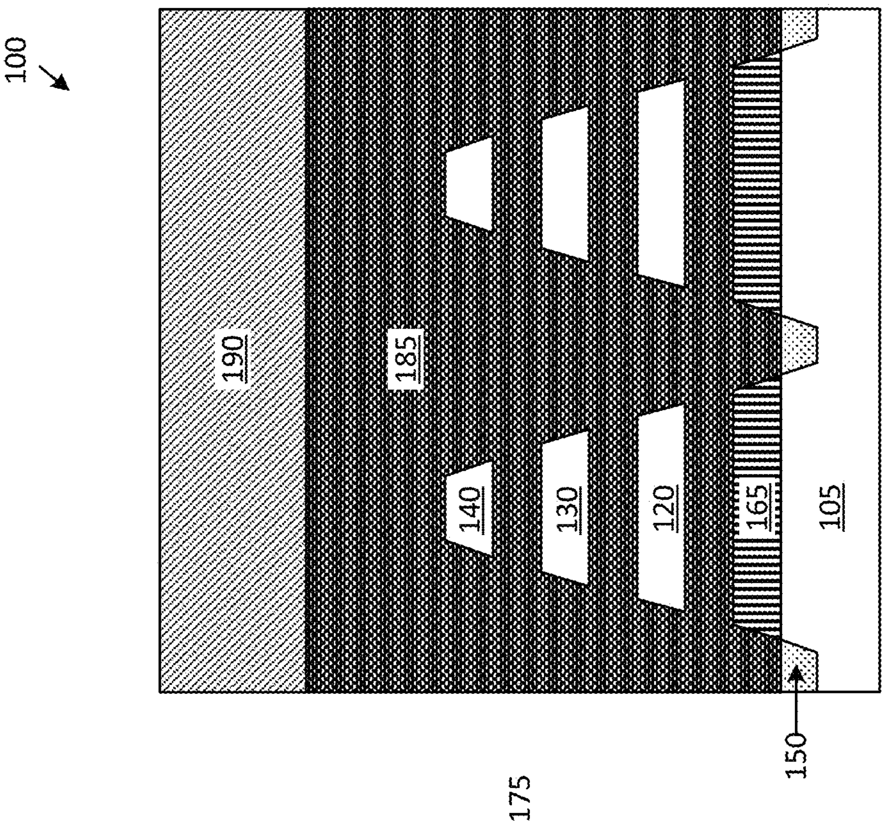
FIG. 23 illustrates cross section B of the nano device after the formation of the gate, in accordance with the embodiment of the present invention.

FIG. 22 illustrates cross section A of the nano device 100 after the formation of the gate 185, in accordance with the embodiment of the present invention. FIG. 23 illustrates cross section B of the nano device 100 after the formation of the gate 185, in accordance with the embodiment of the present invention. A gate 185 is formed around the third layer 120, the fifth layer 130 and the seventh layer 140. The gate 185 can be comprised of, for example, a High-K metal gate, a conductive metal, or any other suitable gate material. A cap 190 is formed on top of the gate 185 to seal the top surface of the gate 185.

Figure 25:
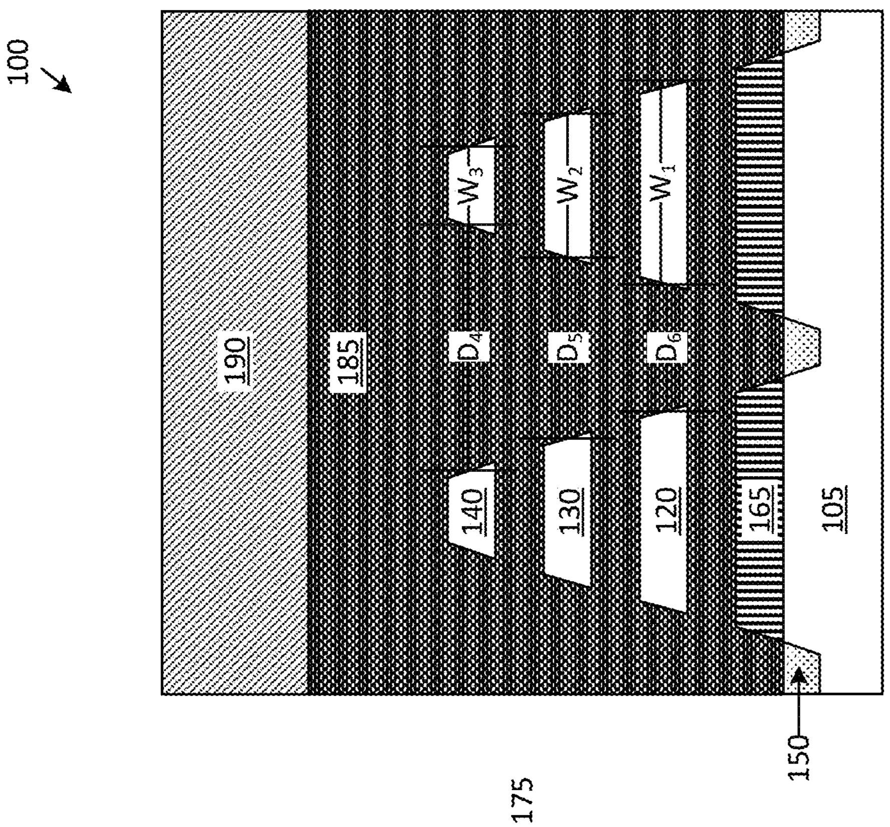
FIG. 25 illustrates cross section B of the nano device after the replacement of the ILD layer, in accordance with the embodiment of the present invention.
Figure 24:
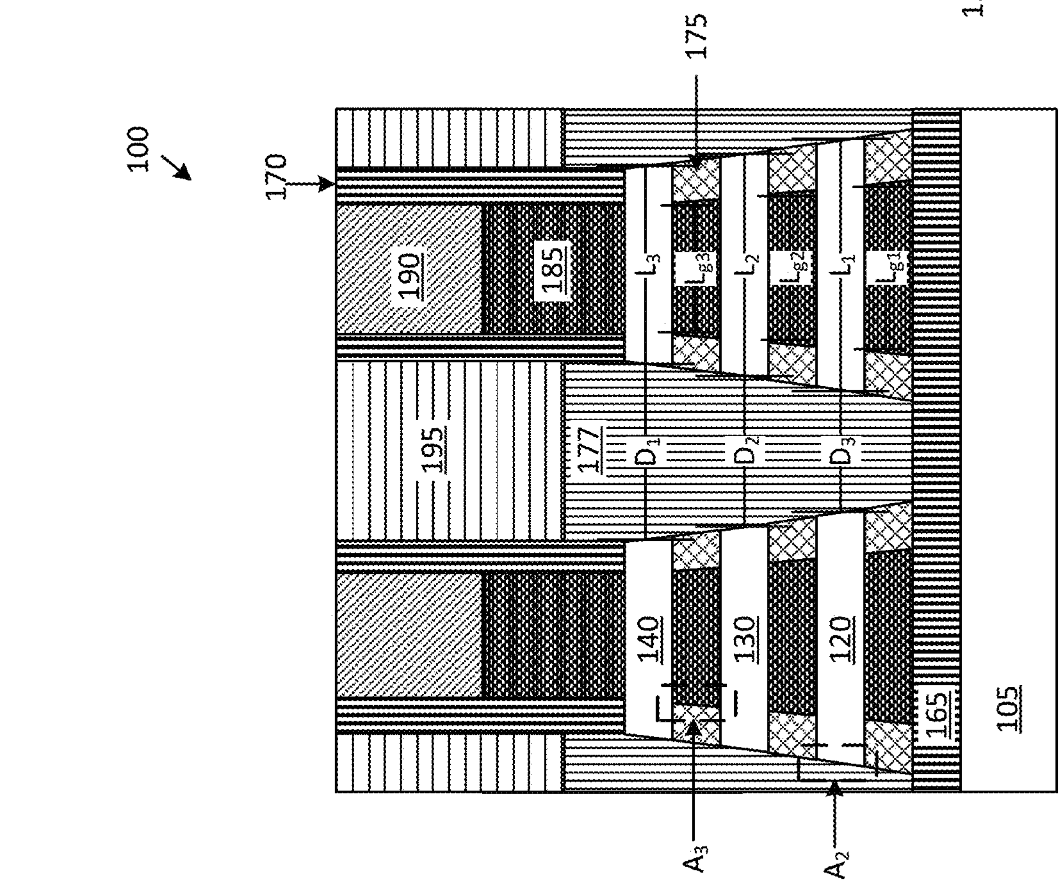
FIG. 24 illustrates cross section A of the nano device after the replacement of the ILD layer, in accordance with the embodiment of the present invention.

FIG. 24 illustrates cross section A of the nano device 100 after the replacement of the ILD layer 180, in accordance with the embodiment of the present invention. FIG. 25 illustrates cross section B of the nano device 100 after the replacement of the ILD layer 180, in accordance with the embodiment of the present invention. The ILD layer 180 is removed and replaced with a metal contact layer 195. The channels (the third layer 120, the fifth layer 130, and the seventh layer 14) of the nano device 100 each have different widths (such that, $W_1<W_2<W_3$), each have different lengths (such that, $L_1>L_2>L_3$), and each have different gate lengths (such that, $Lg_1>Lg_2>Lg_3$). The tapering of the channels causes the channels to have different widths and lengths, thus the tapering enables the channels to have different geometries. The distance $D_1$ is the distance between each of the top channels (seventh layer 140 in each of the tapered columns of the nano stack 102) in the same dimension as length $L_3$. The distance $D_2$ is the distance between each of the middle channels (fifth layer 130 in each of tapered columns of the nano stack 102) in the same dimension as length $L_2$. The distance $D_3$ is the distance between each of the bottom channels (third layer 120 in each of tapered columns of the nano stack 102) in the same dimension as length $L_1$. The distances have a relationship such that $D_1>D_2>D_3$. The distance $D_4$ is the distance between each of the top channels (seventh layer 140 in each of tapered columns of the nano stack 102 as illustrate by FIG. 25) in the same dimension as width $W_3$. The distance $D_5$ is the distance between each of the middle channels (fifth layer 130 in each of tapered columns of the nano stack 102 as illustrate by FIG. 25) in the same dimension as width $W_2$. The distance $D_6$ is the distance between each of the bottom channels (third layer 120 in each of tapered columns of the nano stack 102 as illustrate by FIG. 25) in the same dimension as width $W_1$. The distances have a relationship such that $D_4>D_5>D_6$.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A semiconductor device comprising:

a first nanosheet having a tapered profile in the Y-direction to have a width $W_1$ and the first nanosheet is tapered in the X-direction to have a length $L_1$, wherein the tapered profile in the Y-direction is at a first angle and the tapered profile in the X-direction is at a second angle;

a second nanosheet having a tapered fin profile in the Y-direction to have a width $W_2$ and the first nanosheet is tapered in the X-direction to have a length $L_2$, wherein the tapered profile in the Y-direction is at the first angle and the tapered profile in the X-direction is at the second angle, wherein the first angle and the second angle are different;

a bottom dielectric isolation layer located beneath the first and second nanosheets, wherein the bottom dielectric isolation layer has a tapered profile in the Y-direction and a different profile in the X-direction; and wherein the widths $W_1$ and $W_2$ are different from each other and the lengths $L_1$ and $L_2$ are different from each other.

2. The semiconductor device of claim 1, wherein the second nanosheet is located above the first nanosheet.

3. The semiconductor device of claim 2, wherein the width W1>W2 and the length L1>L2.

4. The semiconductor device of claim 3, further comprising:

a nanowire located above the second nanosheet, wherein the nanowire has a tapered fin profile in the Y-direction and a tapered profile in the X-direction, wherein the nanowire has a width W3 and a length L3, wherein the width W1>W2>W3 and the length L1>L2>L3, wherein the tapered fin profile in the Y-direction is at the first angle and the tapered profile in the X-direction is at the second angle.

5. The semiconductor device of claim 3, further comprising:

a third nanosheet located above the second nanosheet, wherein the third nanosheet has a tapered fin profile in the Y-direction and a tapered profile in the X-direction, wherein the third nanosheet has a width W3 and a length L3, wherein the width W1>W2>W3 and the length L1>L2>L3, wherein the tapered fin profile in the Y-direction is at the first angle and the tapered profile in the X-direction is at the second angle.

6. The semiconductor of claim 1, wherein the outer edges of the first nanosheet and the second nanosheet are tapered at angle $A_2$ in the X-direction.

7. The semiconductor of claim 6, further comprising:

a gate layer located between the first nanosheet and the second nanosheet; and an inner spacer located adjacent to the gate layer, where the inner spacer is located between the first nanosheet and the second nanosheet.

8. The semiconductor of claim 7, wherein the outer edge of the inner spacer is tapered at angle $A_4$, wherein the $A_4$ is about equal to angle $A_2$.

9. The semiconductor of claim 7, wherein the outer edge of the gate layer is tapered at angle $A_3$, wherein the angle A3 is about equal to angle $A_2$.

10. A semiconductor device comprising:

a first nanosheet located on top of a substrate, wherein the first nanosheet is tapered the Y-direction to have a width WI and the first nanosheet is tapered in the X-direction to have a length $L_1$, wherein the tapered profile in the Y-direction is at a first angle and the tapered profile in the X-direction is at a second angle; and a second nanosheet located on top of the first nanosheet, wherein the second nanosheet is tapered in the Y-direction to have a width $W_2$ and the second nanosheet is tapered in the X-direction to have a length $L_2$, wherein the tapered profile in the Y-direction is at the first angle and the tapered profile in the X-direction is at the second angle, wherein the first angle and the second angle are different;

a bottom dielectric isolation layer located beneath the first and second nanosheets, wherein the bottom dielectric isolation layer has a tapered profile in the Y-direction and a different profile in the X-direction;

wherein the widths $W_1$ and $W_2$ are different from each other and the lengths $L_1$ and $L_2$ are different from each other; and wherein the substrate includes a tapered surface in the Y-direction.

11. The semiconductor device of claim 10, wherein the width W1>W2 and the length L1>L2.

12. The semiconductor device of claim 11, further comprising:

a nanowire located above the second nanosheet, wherein the nanowire has a tapered fin profile in the Y-direction and a tapered profile in the X-direction, wherein the nanowire has a width W3 and a length L3, wherein the width W1>W2>W3 and the length L1>L2>L3, wherein the tapered fin profile in the Y-direction is at the first angle and the tapered profile in the X-direction is at the second angle.

13. The semiconductor device of claim 11, further comprising:

a third nanosheet located above the second nanosheet, wherein the third nanosheet has a tapered fin profile in the Y-direction and a tapered profile in the X-direction, wherein the third nanosheet has a width W3 and a length L3, wherein the width W1>W2>W3 and the length L1>L2>L3, wherein the tapered fin profile in the Y-direction is at the first angle and the tapered profile in the X-direction is at the second angle.

14. The semiconductor of claim 10, wherein the outer edges of the first nanosheet and the second nanosheet are tapered at angle $A_2$ in the X-direction.

15. The semiconductor of claim 14, further comprising:

a gate layer located between the first nanosheet and the second nanosheet; and an inner spacer located adjacent to the gate layer, where the inner spacer is located between the first nanosheet and the second nanosheet.

16. The semiconductor of claim 15, wherein the outer edge of the inner spacer is tapered at angle $A_4$, wherein the $A_4$ is about equal to angle $A_2$.

17. The semiconductor of claim 15, wherein the outer edge of the gate layer is tapered at angle $A_3$, wherein the angle A3 is about equal to angle $A_2$.

18. A method comprising:

forming a first nanosheet located on top of a substrate, wherein the first nanosheet is tapered the Y-direction to have a width $W_1$ and the first nanosheet is tapered in the X-direction to have a length $L_1$, wherein the tapered profile in the Y-direction is at a first angle and the tapered profile in the X-direction is at a second angle, wherein the first nanosheet was tapered in the Y-direction during a first etching process, wherein the first nanosheet was tapered in the X-direction during a second etching process; and forming a second nanosheet located on top of the first nanosheet, wherein the second nanosheet is tapered in the Y-direction to have a width $W_2$ and the second nanosheet is tapered in the X-direction to have a length $L_2$, wherein the tapered profile in the Y-direction is at the first angle and the tapered profile in the X-direction is at the second angle, wherein the first angle and the second angle are different, wherein the second nanosheet was tapered in the Y-direction during the first etching process, wherein the second nanosheet was tapered in the X-direction during the second etching process;

forming a bottom dielectric isolation layer located beneath the first and second nanosheets, wherein the bottom dielectric isolation layer has a tapered profile in the Y-direction and a different profile in the X-direction, wherein the bottom dielectric isolation layer was tapered in the Y-direction during the first etching process;

wherein the widths $W_1$ and $W_2$ are different from each other and the lengths $L_1$ and $L_2$ are different from each other; and wherein the substrate includes a tapered surface in the Y-direction.

* * * * *